US005500312A

United States Patent [19]
Harriott et al.

[11] Patent Number: 5,500,312
[45] Date of Patent: Mar. 19, 1996

[54] MASKS WITH LOW STRESS MULTILAYER FILMS AND A PROCESS FOR CONTROLLING THE STRESS OF MULTILAYER FILMS

[75] Inventors: Lloyd R. Harriott, Gillette; James A. Liddle, Scotch Plains; Cynthia A. Volkert, Springfield; Warren K. Waskiewicz, Clinton; David L. Windt, Berkeley Heights, all of N.J.

[73] Assignee: AT&T Corp., Murray Hill, N.J.

[21] Appl. No.: 321,362

[22] Filed: Oct. 11, 1994

[51] Int. Cl.⁶ .................................................. G03F 9/00
[52] U.S. Cl. .............................. 430/5; 430/312; 430/313; 428/428; 428/432; 378/34; 378/35
[58] Field of Search ............................ 430/5, 312, 313; 428/428, 432; 378/34, 35

[56] References Cited

U.S. PATENT DOCUMENTS

| | | | |
|---|---|---|---|
| 4,998,267 | 3/1991 | Lee et al. | 430/5 |
| 5,249,554 | 10/1993 | Tamor et al. | 123/90.51 |
| 5,287,081 | 2/1994 | Kinard et al. | 338/24 |
| 5,294,808 | 3/1994 | Lo | 257/17 |
| 5,306,946 | 4/1994 | Yamamoto | 257/640 |

OTHER PUBLICATIONS

Y.-C. Ku et al. "In situ stress monitoring and deposition of zero-stress W for x-ray masks", *J. of Vacuum Science & Tech.* B9 pp. 3297–3300 (1991).

J. R. Maldanado, "X-Ray Lithography, Where it is Now, and Where it is Going" *J. Electronic Materials*, vol. 19, pp. 699–709 (1990).
R. K. Watts, "VLSI Technology", by S. M. Sze, Chapt. 4, 2nd edition 1988.
R. R. Kola et al. "Stress relaxation in Mo/Si multilayer structures" *Appl. Phys. Lett* vol. 60, pp. 3120–3122 (1992).
R. R. Kola et al. "Stable low-stress tungsten absorber technology for sub-half-micron x-ray lithography" *J. Vac. Sci. Technol.* B9 pp. 3301–3305 (1991).
K. Suzuki, et al. "X-ray mask technology: Low-stress tungsten deposition and sub-half micron absorber fabrication by single-layer resist" *Microelectronic Engineering* vol. 14, pp. 207–214 (1991).

Primary Examiner—S. Rosasco
Attorney, Agent, or Firm—Richard J. Botos

[57] ABSTRACT

A process for controlling the stress of multilayer films formed on a substrate is disclosed. A plurality of periods, each period having at least two layers of material wherein one of the layers of material is under compressive stress and the other layer of material is under tensile stress, are formed in a substrate. The stress in the multilayer film is controlled by selecting a thickness for the layer under compressive stress and a thickness for the layer under tensile stress that will provide a multilayer film of the desired stress. The thickness of each layer is about 0.5 nm to about 10 nm. Multilayer films with a stress of about −50 MPa to about 50 MPa are obtained using the present process. The present invention is also directed to masks with such multilayer films.

13 Claims, 1 Drawing Sheet

MASKS WITH LOW STRESS MULTILAYER FILMS AND A PROCESS FOR CONTROLLING THE STRESS OF MULTILAYER FILMS

BACKGROUND OF THE INVENTION

1. Technical Field

The invention is directed to a lithographic process for fabricating devices and, in particular, fabricating masks that include a patterned multilayer film on a membrane.

2. Art Background

As design rules in the manufacture of devices, e.g., integrated circuits, opto-electronic devices, and micro-mechanical structures, become smaller, the radiation employed for lithography, in turn, must be of a correspondingly shorter wavelength. Thus, for example, when the design rule is below 0.5 microns, use of short wavelength radiation such as x-ray radiation (radiation having a wavelength typically in the range of 4 to 150 Å), or charged particles, e.g. ion beam and electron beam, has been suggested.

In one lithographic technique, during exposure, energy incident on a mask which defines a pattern is transmitted in this pattern to expose an underlying energy sensitive material. The exposed energy sensitive material is then delineated into the pattern by development and employed in the manufacture of the desired device. For exposures such as x-ray, ion beam and electron beam, the mask is generally a membrane with a supporting structure (e.g. a ring formed from the substrate on which the membrane and the multilayer film are formed) with a region of patterned metal coating the membrane surface. For convenience, the membrane and its supporting structure are collectively referred to herein as the substrate. Typically, the membrane is a material such as Si, $SiN_x$, (x is typically between 1 and 1.3) SiC, or diamond-like materials and has a thickness generally in the range 0.05 to 4 μm. As used herein, "membrane" refers to a substrate or a layer of material formed on a substrate with a thickness in about this range.

Substantial stress, i.e., stress greater than 50 (MPa) megapascals, imposed on the membrane from the overlying metal pattern is unacceptable because it causes unacceptable distortion of the pattern. The requirement of limited stress, in turn, imposes substantial limitations on the process of forming the overlying metal pattern.

In a typical mask fabrication procedure, a layer of metal is formed on a membrane by conventional processes such as sputtering. A pattern in polymeric material is formed over the metal layer, and the metal regions not covered by the polymeric material are removed by etching. Subsequent removal of the overlying polymeric material leaves a patterned metal overlying the membrane. Alternatively, the membrane is formed in a substrate after the metal layer is formed thereon.

Various materials have been suggested for use in the metal layer. Although gold is relatively easy to deposit, its presence in device manufacturing environments, and, in particular, integrated circuit manufacturing environments, is not preferred. Gold impurities, even in extremely small amounts, introduced into an integrated circuit often substantially degrade the properties and reliability of the device. Stress in gold films is also known to change with time, even at room temperature. Recent studies indicate that at temperatures above 70° C., stresses increase rapidly. Therefore, materials other than gold have been investigated.

One alternative to gold is tungsten. Although tungsten is considered compatible with an integrated circuit manufacturing environment, tungsten films deposited on a membrane generally induce substantial compressive or tensile stress that ultimately distorts the pattern or even produces membrane failure. Various attempts have been made to reduce the stress associated with the deposition of metals. For example, as described by Y. C. Ku et al., *Journal of Vacuum Science & Technology*, B9, 3297 (1991), a monitoring method is employed for determining stress in the tungsten being deposited. This monitoring method is based on the resonant frequency, f, of a circular diaphragm of the composite structure which, in turn, is related to the stress by the equation:

$$f = \frac{1}{2.61r} \left\{ \frac{\sigma_m t_m + \sigma_f t_f}{\rho_m t_m + \rho_f t_f} \right\}^{1/2}, \quad (1)$$

where r is the radius of the membrane, $\sigma_m$, $\rho_m$, and $t_m$ are stress, density, and thickness of the membrane, respectively, and the corresponding terms such as $\sigma_f$ are stress, density, and thickness, respectively, of the film. Since the density of the film and membrane are generally known, this equation allows calculation of stress once the resonant frequency and film thickness are measured.

Ku, and coworkers, used a commercially available optical distance measuring device to monitor diaphragm position. Movement of the diaphragm was induced by electrostatic forces applied to the diaphragm from an electronic oscillator-driven capacitively coupled electrode. The oscillator frequency was slowly swept to allow location of the diaphragm mechanical resonance and from this value, the stress was determined.

SUMMARY OF THE INVENTION

The invention is directed to a process for fabricating a mask with a multilayer film. The process controls the amount of stress in the multilayer film. Films with stresses outside the range of about −50 MPa to about 50 MPa can make the resulting mask unsuitable for certain applications.

The multilayer film is a film that is made of a plurality of individual layers. The individual layers are in a particular order in the multilayer film (e.g. $1_1, 1_2, 1_3$, etc.). Typically, the multilayer film will have a series of two or more layers made of different materials (i.e. $1_1$ is made of a first material ($m_1$) and $1_2$ is made of a second material ($m_2$)). This series of layers is repeated one or more times in the multilayer film (e.g. $1_1, 1_2, 1_3, 1_1, 1_2, 1_3$, etc.). For convenience, each individual series of layers is referred to as a period (i.e. $1_1+1_2+1_3$ in the above example equals one period). Each individual period has at least two layers.

Typically, each layer in the period is made of a different material. At least one of the layers of material in each period is under a compressive stress and at least one of the layers of material is under a tensile stress. If the period has more than two layers, one or more layers is under compressive stress and one or more layers is under tensile stress. The thicknesses of the layer or layers under compressive stress and the layer or layers under tensile stress are selected to achieve the desired mount of stress in the multilayer film. It is advantageous if the layers in each multilayer film are about 0.5 nm to about 10 nm thick.

The thicknesses of the individual layers that will provide a multilayer film with the desired stress are determined using techniques well known to those skilled in the art. For example, a series of multilayer films is formed on a series of substrates. The curvature of each substrate is measured before the multilayer film is formed thereon. Each multilayer film has a plurality of periods with a plurality of layers as described above. The thickness of any given layer is constant from period to period in any given film. However, the thickness of one layer is varied from film to film. The curvature of each wafer is measured again after the multilayer film is formed thereon to determine the effect of the thickness of that layer on wafer curvature. A series of such films is formed to determine the effect of the thickness of each individual layer of material on film stress. From this, the thickness of the layers that will provide a film with the desired stress is determined.

After the thicknesses of the layer or layers under compressive stress and the layer or layers under tensile stress are selected, a film with a plurality of periods, each period having at least one layer under compressive stress and one layer under tensile stress, wherein the thickness of each individual layer in the multilayer film is about 0.5 nm to about 10 nm, is foraged on the substrate. For x-ray and electron beam lithographic process, the substrate is the membrane and its supporting structure. The supporting structure is typically formed from a silicon wafer. The membrane is typically a layer of material formed on the wafer. The material selected for the membrane depends upon how the resulting mask is used. For example, if the film is to be used as a mask in an x-ray lithographic process for device fabrication, the membrane material is selected for its ability to transmit the exposing radiation. Such materials are typically Si or $SiN_x$ (x is about 1 to about 1.3), SiC, or diamond-like materials.

If the resulting multilayer film is to be used in an e-beam lithography mask, it is advantageous if at least one of the material layers in the period scatters electrons to an extent that the contrast between the transmission of electrons through the material in the multilayer film and the transmission of electrons through the membrane is greater than about 95 percent. Examples of materials that provide the requisite scattering of electrons include molybdenum (Mo), tungsten (W), and tantalum (Ta). One skilled in the art will appreciate that suitable masks are formed with multilayer films that have one or more layers of material in each period that significantly scatters electrons.

If the resulting films are used as a mask for x-ray or ion beam lithography, it is contemplated that at least one of the material layers absorbs the radiation or particles, respectively, used for the exposure. Examples of materials that absorb x-ray radiation include high atomic number metals such as gold (Au), W, and Ta. Most materials absorb ions effectively.

Materials such as Si, $SiN_x$, and carbon (C) are typically under compressive stress when formed into films with a thickness of about 0.5 nm to about 10 nm. Therefore, one embodiment of the present invention contemplates a multilayer film that contains periods with a layer made of Si, $SiN_x$ or C and a layer made of a material that scatters electrons (e.g. Mo, W, and Ta).

As stated previously, it is advantageous, in the context of mask fabrication, if the multilayer film has very low stress so that the pattern introduced into the film will not distort to an unacceptable degree. Therefore, it is advantageous if the film has a stress of about 5 MPa to about −5 MPa if the film is used as a mask in x-ray lithography. If the film is used as a mask for e-beam lithography, it is advantageous if the film has a stress of about −50 MPa to about 50 MPa. If the film is used as a mask for ion beam lithography, it is advantageous if it has a stress of about 0 to about 10 MPa.

The number of periods in the multilayer film is largely a matter of design choice. For example, if a mask with a multilayer silicon/molybdenum film as described above is to be used in an electron beam lithography process, then a total molybdenum thickness of about 80 nm is needed to provide the requisite amount of electron scattering. A multilayer film consisting of about 25 silicon/molybdenum periods, each period having a molybdenum thickness of 3 nm, has the necessary molybdenum thickness for this purpose.

The individual layers of material are deposited by conventional techniques such as sputtering in an inert gas atmosphere. The thicknesses of the layers of material in the period arc controlled using conventional techniques for sputtering films with a desired thickness onto a substrate.

The present invention is also directed to a mask with a patterned multilayer film. The film is formed on a membrane if the mask is used in x-ray or e-beam lithography. The film is free-standing if the mask is used in ion beam lithography. Free standing means that portions of the substrate underlying the film are completely removed. The multilayer film is a plurality of periods, wherein each period has at least two layers. At least one of the layers in each period is under compressive stress and at least one layer in the period is under tensile stress. The individual layers in each period of the film have a thickness of about 0.5 nm to about 10 nm. The stress of the multilayer film is about −50 MPa to about 50 MPa. It is advantageous if the material from which the layers in the period arc made are the materials described above.

DETAILED DESCRIPTION

Masks arc used in device fabrication for the patternwise delineation of energy sensitive material in lithographic processes for device fabrication. Energy in the form of x-ray radiation or charged particles such as electron and ion beam is used for this patternwise delineation to fabricate devices with design rules of less than 0.35 μm.

Masks for use in x-ray and electron beam lithography are formed by producing a thin supporting membrane having a thickness in the range of 0.05 to 4 microns. Suitable materials for the membrane include Si, $SiN_x$, (x is typically between 1 and 1.3) SiC and diamond like materials. Various processes for forming such membranes have been described in J. R. Maldanado, *J. Electronic Materials,* Vol. 19, p. 699 (1990). In these processes, a metal layer or, in the case of the present invention, a multilayer film, that is ultimately to be delineated into the desired pattern is deposited on the surface of what is ultimately to be the membrane either before or after membrane formation.

Masks for use in ion beam lithography are typically free-standing stencil masks. In stencil masks, portions of the substrate underlying the multilayer film are completely removed and only those portions of the substrate that support the overlying film remain.

In the process of the present invention, a multilayer film is formed on a substrate. As noted above, for x-ray and electron beam masks, a membrane is formed either before or after the film is formed thereon. Because the resulting masks are used in processes to fabricate devices with design rules of 0.35 μm or less, the stress of the multilayer film must be controlled to avoid unacceptable distortion of the pattern in the multilayer film.

Figure 1:
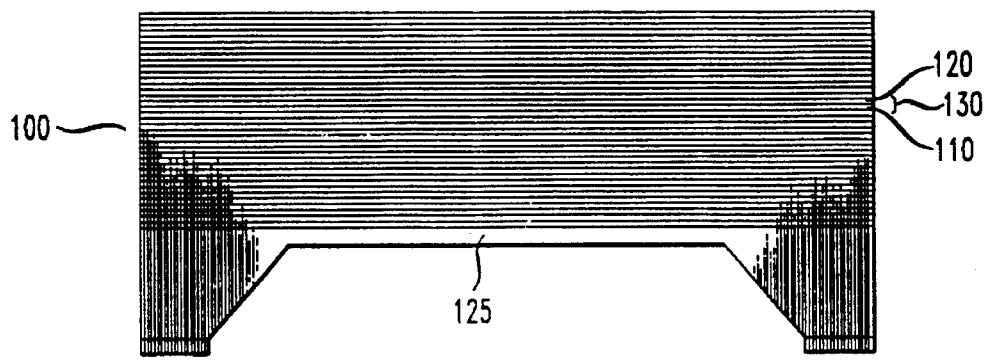
FIG. 1 is a cut away view of a multilayer film of the present invention.

In one example of the present process, the stress in the multilayer film, illustrated in FIG. 1, is controlled by forming the multilayer film 100 of alternating layers of material 110 and 120 on a membrane 125. Each pair of alternating material layers 110 and 120 is denominated a period 130. One layer of material is under compressive stress and the other layer of material is under tensile stress. For example, in a multilayer film in which each period has two layers, the stress in the film is the sum of the stresses in each period. These stresses ($\sigma_1$ for the stress of the first layer, $\sigma_2$ for the stress of the second layer) are a function of the thickness of each layer ($t_1$ and $t_2$, respectively). There is also a stress due to the surface energy at the interface of the two layers, which is expressed as $\gamma_{12}$. The stress of a given period is expressed as:

$$\sigma_1 t_1 + \sigma_2 t_2 + 2\gamma_{12} = \sigma_{period}(t_1 + t_2) \qquad (2)$$

The stress of a multilayer film is $\sigma_{period}$ times the number of periods in the film.

The multilayer film typically has a plurality of periods 130. It is contemplated that the periods in the multilayer film will also have more than the two layers depicted in FIG. 1. However, at least one layer in each period is under compressive stress and at least one layer in each period is under tensile stress. The number of periods is largely a matter of design choice.

If the low stress multilayer films of the present invention are to be used as masks in processes for device fabrication, the layers of the film period must perform the requisite masking function in addition to providing the tensile or compressive stress needed to make a low stress film. For example, if a multilayer film is to be used in a mask for electron beam radiation, one of the layers of material in the period must scatter electrons sufficiently to provide a contrast between the transmission of electrons through the layer and the transmission of electrons through the underlying membrane that is greater than 95 percent. Since the underlying membrane is made of elements with low atomic number (e.g. Si, $SiN_x$), the membrane scatters very little. Accordingly, to achieve the desired contrast from the mask, the film must contain an element that scatters somewhat strongly. Such elements have high atomic numbers and examples of these materials include W, Ta, Au, Mo and the like materials. It is advantageous if the contrast between the film and the membrane with regard to electron scattering is ninety-five percent or greater. The contrast is defined as $$\text{Contrast} = \left[ 1 - \frac{T_{scatter}}{T_{membrane}} \right]$$

where $T_{scatter}$ is a measure of the fraction of electrons unscattered by the scattering material and $T_{membrane}$ is a measure of the electrons unscattered by the membrane. $T_{scatter}$ and $T_{membrane}$ are a function of the thickness of the material, i.e. the scattering effects increase with increased thickness.

The above materials (e.g. W, Ta, etc.) are also useful in multilayer films for x-ray and ion beam masks. This is because these materials will absorb the applicable radiation or ions. The degree to which these materials will absorb the relevant particles or radiation depends upon the particular material and the cumulative thickness of its layers in the multilayer film.

It is advantageous if each individual layer in each multilayer film has a thickness of about 0.5 nm to about 10 nm. It is advantageous for the film to be thinner than the membrane (0.5 μm to 4 μm) on which it is formed. Since the film is patterned, it is subjected to more processing variations from mask to mask than the membranes. If the membrane is thicker than the film, then it is less likely that these processing variations will produce significant mask-to-mask variations. Also, features in a thin film have lower aspect ratios (height/width) than the same feature size in a thicker film. Lower aspect ratio patterns are easier to delineate accurately.

Since the stress of a particular film varies with thickness, the materials selected for the multilayer film must have the appropriate stress within the specified thickness range of about 0.5 nm to about 10 nm. In this thickness range, the film stress of materials such as Mo, Au, Ta, and W is typically tensile. Although these materials can be formed into films under compressive stress, it is not required. Other materials such as Si, $SiN_x$, and C, which do not scatter electrons to the extent of elements with higher atomic numbers, are contemplated as useful in the films of the present invention. Films formed from these materials are typically under compressive stress in the thickness range of about 0.5 nm to about 10 nm. In one embodiment of the present invention, each period has a layer of either Mo, Au, Ta, or W, and a layer of $SiN_x$, Si, or C.

The masks described above have films with layers of material that scatter electrons, absorb x-ray radiation, etc. These materials make the film suitable for use in a mask for a particular application. However, it is important to note that, whatever materials are selected, at least one of the layers in each period is under tensile stress and at least one of the layers is under compressive stress. In this regard, films in which multiple layers in a period are made of material that substantially scatters electrons are contemplated.

The thicknesses of the layers under compressive stress and the layers under tensile stress are controlled to form a multilayer film of the desired stress. The thicknesses are selected using techniques well known to one skilled in the art. For example, a series of multilayer films are formed in which the thickness of one of the layers in each period of a given film is held constant, but is varied from film to film, while the thickness of the other material is kept constant in each period of every film. The stress of each multilayer film is then determined by measuring the curvature of the wafer both before and after the film is formed thereon. The stress in the film is determined from the change in the wafer curvature using the following equation:

$$\sigma = \frac{E_s t_s^2}{6 t_f R} \qquad (3)$$

In equation (3), $\sigma$ is film thickness, $1/R$ is wafer curvature, $E_s$ is the biaxial modulus of the substrate, $t_f$ is the film thickness, and $t_s$ is the substrate thickness. From this information the thicknesses of the layers in each period are selected that will provide a film of the desired stress.

For example, if a multilayer film with 40 periods, each having a layer of Mo with a thickness of about 3 nm and a layer of Si with a thickness of about 3 nm is formed on a substrate, the stress of the resulting film is about 5 MPa to about −5 MPa. In this example, the Mo layer is under tensile stress and the Si layer is under compressive stress. If the multilayer film is made of other materials, and the stress of the film is desired to be about 5 MPa to about −5 MPa, then the appropriate thicknesses of the layers of individual materials in each period of the multilayer film are selected in the above-described manner to provide a film with the desired stress.

The multilayer films of the present invention offer certain advantages. For example, since the individual layers of material are rather thin, i.e. less that 10 nm and typically 0.5 to 5 nm, the grain size (i.e. the size of individual particles of the material that make up the layer) of the material that has the large electron-scattering cross-section is small compared to the grain size in thicker layers. Layers with a smaller grain size exhibit less edge roughness when patterned, which is advantageous for device fabrication.

Furthermore, the thickness of the layers is easier to control than processing conditions which are typically manipulated to obtain a single layer film of a certain stress. This is because the film stress changes rapidly with a very small change in the process conditions. Consequently, any range of deposition conditions that must be maintained to deposit a film with a certain desired stress is narrow. The thickness of a layer is much easier to control reproducibly than the deposition conditions. Thus, the process of the present invention allows films with the desired stress to be produced in a reproducible manner.

The multilayer films are formed on the substrate using conventional techniques. Vapor phase deposition procedures such as sputtering or evaporation as described by Y. C. Ku et al. and J. L. Vossen in Chapt. II-1 of "Thin Film Processes," by J. L. Vossen and W. Kern, 1978 (Academic Press), are useful for deposition. The multilayer film of the present invention is formed on a substrate (for electron beam, ion beam, and x-ray lithography masks) using conventional processing techniques such as a sputtering chamber. In the example where the periods in the multilayer film have two layers, two targets are provided, one target for the first material layer and one target for the second material layer in the period. A layer of material is deposited on the substrate when the substrate has completed one revolution in the chamber. The speed at which the substrate makes that revolution is controlled to determine the thickness of the layer. The faster the revolution, the thinner the layer that is formed. Accordingly, the slower the revolution, the thicker the layer that is formed.

After the multilayer film is formed on the substrate, the membrane is formed by backside etching of the substrate. In the case of ion beam masks, portions of the substrate beneath the multilayer film are completely removed. A layer of photosensitive polymeric material is then formed, exposed, and delineated onto the film by conventional techniques as described by R. K. Watts in Chapter 4 of "VLSI Technology," by S. M. Sze, 2nd edition 1988 (McGraw-Hill), to have open regions corresponding to the desired pattern in the underlying multilayer film. The regions of multilayer film underlying these open regions are then removed by a conventional etching process such as reactive ion etching. Removal of the polymeric material after etching is performed by conventional techniques such as plasma etching.

EXAMPLE 1

Multilayer films were deposited on a silicon substrate with a thickness of 100 microns using DC magnetron sputtering in an argon atmosphere. Two planar targets, measuring 50.8×8.9×0.6 cm were used to sputter alternating sublayers of Si and Mo onto the substrate. The Si target had a purity of 99.999% and the Mo target had a purity of 99.9%.

Figure 2:
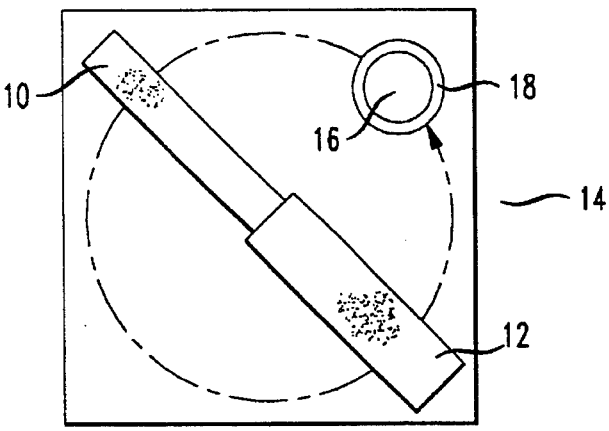
FIG. 2 is a schematic of a sputtering chamber used to form the films of the present invention.

As depicted in FIG. 2, the magnetrons 10 and 12, obtained from VacTec, Inc. of Boulder, Colo., were mounted, facing upward, along the diagonal of the square stainless-steel vacuum chamber 14. The substrate 16 is mounted facing downward on a platen 18 that spins as it rotates over each magnetron source, 10 and 12. The vertical distance between the targets and the substrate 16 was about 90 min. One layer of either Si or Mo was formed on the substrate per rotation of the substrate 16 over the magnetron sources 10 and 12. The spinning of the platen 18 was controlled by a DC motor operating at 235 rpm. The rotation of the substrate 16 over the magnetron sources was driven by a computer-controlled stepper-motor (not shown) with gear reduction, and operates at any desired rotation rate between 0.00003 and 5.5 rpm.

The deposition chamber was evacuated to a pressure of 0.4 Torr using a rotary piston pump. The pressure in the chamber was further reduced to a high vacuum using a cryopump (model CT-10 obtained from CTI of Waltham, Mass.) that had a pumping speed of 3000 l/s for air and 9000 l/s for water vapor. The argon pressure was maintained at the same level throughout the deposition of the multilayer film on the substrate using a closed-loop feedback system having a mass-flow controller (MKS model 2259C obtained from MKS of Andover, Md.) and a capacitance manometer (MKS model 390HA). The argon had a purity of 99.998 percent. The argon pressure was maintained at 1.5 mTorr during deposition and the argon flow rate was about 230 sccm. The magnetron sources were powered by a 1 KW power supply (Model 2011 obtained from Advanced Energy of Fort Collins, Colo.). The power supply was operated in the regulated power mode at 200 W. The power supply and the argon gas pressure were maintained at constant levels throughout the deposition of the multilayer film on the substrate. The power supplies (one for each magnetron) were ramped to full power over a period of two minutes, with an additional 20-minute warm-up period prior to film growth.

Multilayer films consisting of 40 individual periods, each period having a layer of Si and a layer of Mo, were deposited on Si wafers as described above. In one series of films, the Mo layer thickness was 3 nm and the Si layer thickness was varied from 1 to 5 nm in 0.5 nm increments from film to film. In the other series of films, the thickness of the Si layer was fixed at 3 nm and the Mo layer thickness was varied from 1 to 5 nm in 0.5 nm increments from film to film. The stress of each film was measured using the wafer curvature technique using a laser scanning apparatus. This apparatus measured the deflection of a HeNe laser beam as it scanned along the surface of the sample. The wafer curvature was measured before and after the multilayer film was formed on the substrate. The film stress was computed using equation (3) above. The substrate thicknesses were measured with a micrometer, and the film thickness was determined by measuring the multilayer period using x-ray diffraction. A value of 180 GPa was used for E. The wafer curvature measurements are accurate to within plus-or-minus five percent.

Figure 3:
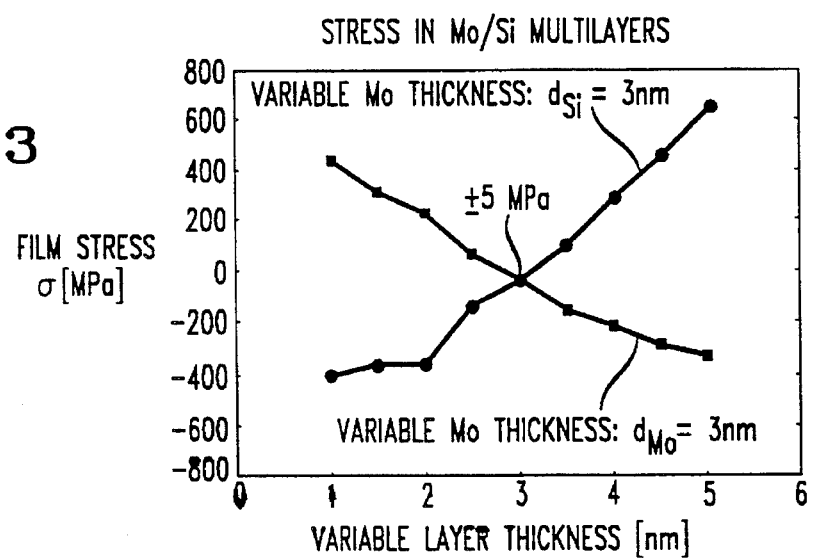
FIG. 3 is a graph illustrating the effect of the thickness of one of the layers in the two-layer periods of a multilayer film on the stress of the film.

The stress of the multilayer films formed on the substrate as described above were measured and the stress in these various films is illustrated in FIG. 3. The thickness of the individual layers of Si were varied by adjusting the speed of rotation of the substrate. Since one layer of material was deposited per revolution, the speed of rotation was directly related to the thickness of the individual layer. For example, 3 nm layer of silicon is formed on the substrate at a speed of 0.286 rpm. A 3 nm layer of Mo is formed on the substrate at a speed of 0.4043 rpm. The slower the rotation, the thicker the layer. Accordingly, the faster the rotation, the thinner the layer. As illustrated in FIG. 3, the stress of the multilayer films went from tensile to compressive as the thickness of the Si layer increased. Also, the stress of the multilayer films went from compressive to tensile as the thickness of the Mo layer increased. Multilayer films in which the Mo layers and the Si layers were each about 3 nm in thickness had a film stress of about 5 MPa to about −5 MPa.

FIG. 3 illustrates that reducing the thickness of a multilayer film in which the thickness of the Si layer in each period is 3 nm and the thickness of the Mo layer in each period is 2.85 (ratio of Si thickness to Mo thickness equal to 1.05) will have a stress of about zero. FIG. 3 also illustrates that a multilayer film in which the thickness of the Si layer in each period is 2.8 and the thickness of the Mo layer in each period is 3 nm (ratio of Si thickness to Mo thickness equal to 0.93) will have a stress of about zero.

We claim:

1. A process for fabricating a mask comprising:
   forming a multilayer film on a substrate by forming a plurality of periods, each period comprising at least two layers, wherein at least one layer in the period is under compressive stress and at least one layer in the period is under a tensile stress, each layer having a thickness of about 0.5 nm to about 10 nm wherein the thickness of the layers under compressive stress and the thickness of the layers under tensile stress are selected so that the stress of the resulting multilayer film is about −50 MPa to about 50 MPa and wherein at least one of the layers in the period is a metal layer.

2. The process of claim 1 wherein at least one of the layers in the period is made of a material selected from the group consisting of Molybdenum (Mo), and tungsten (W) and tantalum (Ta).

3. The process of claim 2 wherein at least one of the layers in the period is made of a material that is selected from the group consisting of carbon (C), silicon (Si), and silicon nitride ($SiN_x$) wherein x is about 1 to about 1.3.

4. The process of claim 3 wherein the first material is Si with a thickness of about 2.9 nm to about 3.1 nm and the second material is Mo with a thickness of about 2.9 nm to about 3.1 nm.

5. The process of claim 1 wherein the stress of the film is about 5 MPa to about −5 MPa.

6. The process of claim 1 further comprising delineating a pattern into the multilayer film, thereby forming a mask.

7. A mask comprising a multilayer film formed on a substrate wherein the multilayer film comprises a plurality of periods in which each period comprises at least two layers, a layer of a first material and a layer of a second material wherein the thickness of each layer is about 0.5 nm to about 10 nm and wherein at least one of the layers in each period is under compressive stress and at least one of the layers in each period is under tensile stress and wherein the stress of the multilayer −50 Mpa to about 50 Mpa and wherein at least one of the layers in the period is a metal layer.

8. The mask of claim 7 wherein the material under tensile stress is selected from the group consisting of molybdenum (Mo), tantalum (Ta) and tungsten (W).

9. The mask of claim 8 wherein the material under compressive stress is selected from the group consisting of carbon (C), silicon (Si), and silicon nitride (SiN) wherein x is about 1 to about 1.3.

10. The mask of claim 9 wherein the first material is Si with a thickness of about 2.9 nm to about 3.1 nm and the second material is Mo with a thickness of about 2.9 nm to about 3.1 nm.

11. The mask of claim 7 wherein the stress of the multilayer film is about −5 MPa to about 5 MPa.

12. The mask of claim 7 wherein the substrate is a membrane.

13. A process for fabricating a semiconductor device comprising transmitting energy through the mask of claim 7 to patternwise expose an energy sensitive resist material formed on a substrate, and delineating the pattern in the energy sensitive resist material.

* * * * *